United States Patent
P et al.

(10) Patent No.: US 11,798,387 B2
(45) Date of Patent: Oct. 24, 2023

(54) DETERMINATION AND NOTIFICATION OF A LOCATION OF A BUILDING SAFETY SYSTEM EVENT

(71) Applicant: Honeywell International Inc., Charlotte, NC (US)

(72) Inventors: Ranjith Kumar P, Bangalore (IN); K Ganesh, Andalpuram (IN)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/718,595

(22) Filed: Apr. 12, 2022

(65) Prior Publication Data

US 2022/0335799 A1 Oct. 20, 2022

Related U.S. Application Data

(60) Provisional application No. 63/175,248, filed on Apr. 15, 2021.

(51) Int. Cl.
*G08B 17/00* (2006.01)
*G06F 30/13* (2020.01)
(Continued)

(52) U.S. Cl.
CPC ............. *G08B 17/00* (2013.01); *G06F 30/13* (2020.01); *G08B 5/226* (2013.01); *G08B 25/00* (2013.01); *G08B 25/10* (2013.01)

(58) Field of Classification Search
CPC ........ G08B 17/00; G08B 5/226; G08B 25/10; G08B 25/00; G08B 25/009; G06F 30/13
See application file for complete search history.

(56) References Cited

U.S. PATENT DOCUMENTS 5,061,916 A 10/1991 French et al.
10,255,780 B1 4/2019 Wittenberg
(Continued)

FOREIGN PATENT DOCUMENTS

JP 4723813 B2 7/2011
JP 5876371 B2 3/2016
(Continued)

OTHER PUBLICATIONS

Extended European Search Report for related European Application No. 22167822.0, dated Sep. 2, 2022 (10 pgs).
(Continued)

*Primary Examiner* — John A Tweel, Jr.
(74) *Attorney, Agent, or Firm* — Brooks, Cameron & Huebsch, PLLC (57) ABSTRACT

Methods, systems, and devices for determination and notification of a location of a building safety system event are described herein. One embodiment includes a method for notifying a user of a fire system event, comprising detecting an event in a building through an event detection device and transmitting information about at least one of the event or the event detection device to a remote server and to a first computing device. The first computing device may include a memory wherein floorplans of each floor of the building are stored. The method may further comprise determining, based on the information and through the first computing device, a floor of the building on which the first event was detected; transmitting a particular floorplan of that floor to the remote server; determining a specific location within the floor at which the first event was detected; generating a visual floor representation, including an indication of the specific location, based on the particular floorplan and the specific location; and transmitting the visual floor representation to a software application comprised of executable
(Continued)

instructions stored in the memory of a second computing device to present the visual floor representation to a user.

20 Claims, 9 Drawing Sheets

(51) Int. Cl.
  *G08B 25/10* (2006.01)
  *G08B 25/00* (2006.01)
  *G08B 5/22* (2006.01)

(56) References Cited

U.S. PATENT DOCUMENTS

| | | | |
|---|---|---|---|
| 10,348,575 | B2 | 7/2019 | Sundermeyer et al. |
| 10,503,921 | B2 | 12/2019 | Evans |
| 10,872,518 | B2 | 12/2020 | Allen |
| 11,036,897 | B2* | 6/2021 | Tiwari .................. G08B 21/02 |
| 11,100,265 | B2* | 8/2021 | Segev .................... G06N 5/025 |
| 11,356,519 | B2* | 6/2022 | Tiwari .................. H04W 8/005 |
| 11,531,789 | B1* | 12/2022 | Eberhardt ............. H04W 16/20 |
| 11,570,607 | B2* | 1/2023 | Pellegrini ............ G06Q 50/265 |
| 2009/0121860 | A1 | 5/2009 | Kimmel et al. |
| 2019/0081814 | A1 | 3/2019 | Orr |
| 2020/0152035 | A1 | 5/2020 | Kim |
| 2020/0327785 | A1 | 10/2020 | Wedig et al. |
| 2022/0318441 | A1* | 10/2022 | Jagannathan ........... G06T 17/00 |

FOREIGN PATENT DOCUMENTS

| | | |
|---|---|---|
| JP | 2020166497 A | 10/2020 |
| KR | 20050100491 A | 10/2005 |

OTHER PUBLICATIONS

Ya'acob, et al., "Geographical Information System (GIS) Map for Fire and Rescue Application" Jurnal Teknologi, Wireless Communication Technology (WiCoT), Faculty of Electrical Engineering, May 26, 2016 (6 pgs).

* cited by examiner

Fig. 2

11:16
EVENTS
BUILDING NAME

ACTIVE (13)     HISTORY (1196)

FAULT
ACKNOWLEDGED FIRE ALARM
N7.L1.M7 MODULE ADDR 1M007
INITIATING DEVICE | MONITOR
BUILDING NAME
19:17:17 | 06 NOV 2020

FAULT
ACKNOWLEDGED FIRE ALARM
N7.L1.M2 MODULE ADDR 1M002
INITIATING DEVICE | MONITOR
BUILDING NAME
19:17:17 | 06 NOV 2020

OTHER
OTHER | BLOCK ACK
N7 | NO LABEL
FIRE CONTROL PANEL | PANEL
BUILDING NAME
19:17:17 | 06 NOV 2020

FIRE
FIRE ALARM
N7.L1.M7 MODULE ADDR 1M007
INITIATING DEVICE | MONITOR
BUILDING NAME
19:17:16 | 06 NOV 2020

DASHBOARD CHECKPOINT DEVICE EVENTS MORE
LIST

DETERMINATION AND NOTIFICATION OF A LOCATION OF A BUILDING SAFETY SYSTEM EVENT

PRIORITY INFORMATION

This application claims priority to U.S. Provisional Application No. 63/175,248, filed Apr. 15, 2021, the contents of which are incorporated herein by reference in its entirety.

TECHNICAL FIELD

The present disclosure relates to devices, systems, and methods for determination and notification of a location of a building safety system event.

BACKGROUND

Large facilities (e.g., buildings), such as commercial facilities, office buildings, hospitals, and the like, may have an alarm system that can be triggered during an emergency situation (e.g., a fire), for instance, to warn occupants to evacuate. For example, an alarm system may include a control panel (e.g., a fire control panel) within the building and a plurality of event devices (e.g., hazard sensing devices, such as fire detectors, smoke detectors, carbon monoxide detectors, carbon dioxide detectors, other harmful chemical detectors, audio-visual monitoring devices, etc.) located throughout the facility (e.g., on different floors and/or in different rooms of the facility) that can sense a hazard event occurring in the facility and provide a notification of the hazard event to the occupants of the facility via audible or visual alarms or other mechanisms.

In conventional alarm monitoring systems, once an alarm event signal reaches the central monitoring station, the event signal is then transmitted separately to a remote server (e.g., a cloud server) and a workstation remote or local application. The workstation application may also be used to configure the building floor map(s) with all of the building safety device configurations. Upon receiving the event signal, the remote server then transmits information about the event to a number of users through a remote server (e.g., remote), mobile, or local application. The user then receives a notification through the application that contains the detailing the type of event, but there is no visual or textual representation of the precise location of the event within the building.

DETAILED DESCRIPTION

Devices, systems, and methods for determination and notification of a location of a building safety event are described herein. Presently, there is no mechanism in a building safety system to generate visual representations showing exact locations of a building safety event without configuring a remote server (e.g., a cloud server) with the floorplans of each floor of the building. In the present disclosure, notification of building safety events is sent to both a remote server and a computing device (e.g., a personal computer), which already has floorplans for each floor of the building stored in memory. The computing device then communicates with a remote server to generate a visual floor representation of the floor on which the event occurred, indicating the specific location of the event.

Through use of the embodiments described herein, visual representations of floors of a building on which a building safety system event or fault has occurred can be generated without storing floorplans on a remote server and transmitted to mobile, web, or desktop applications to give authorized users precise, real-time notification of such events. Such users will receive not only a text description of the event, but a visual map showing exactly where the event has occurred. This gives the user a better understanding of where the event has occurred, allowing them to navigate there quickly, facilitating efficient resolution of faults, and ensuring that appropriate safety measures are implemented promptly and in the precise areas needed. For example, when a user receives a visual floor representation, as generated in accordance with the embodiments of this disclosure, they may be able to decipher the location of the event more quickly than if they had only been sent a text notification.

As used herein, the term visual floor representation refers to a representation generated based on the floor plan of a particular floor and highlighting or otherwise indicating the specific location of the event. Other components, such as other active detection devices on the floor, may be shown on the visual floor representation as well. When displayed on a graphical user interface (user interface) of a device, users may be able to find more information about the event by selecting the specific location or hovering over it using their finger or an input device such as a mouse. Alternatively, text providing more information about the event may automatically be displayed in or near the specific location on the visual representation.

Furthermore, storing floorplans of each floor in the building on a computing device and transmitting the floorplans from that computing device to the remote server eliminates the need to pre-configure the remote server and user applications with the specific floorplans and device layouts of each floor of the building. Thus, it allows the remote server and user applications to be implemented seamlessly without any existing building safety systems.

Systems of the present disclosure can also be configured to automatically send electronic mail notifications to pre-determined users upon detection of an event. Such notifications can include an image of the generated visual floor representation. These notifications can be transmitted without the need to open the particular floor representation on the mobile, web, or desktop software application, thus allowing users of such software applications to continue viewing representations of other floors while the notification is sent to another user. When users receive the visual floor representation with the specific area of the fault indicated as an electronic mail notification, they are able to determine any necessary next steps in real time without needing to access another application or device or even be present in the building.

As discussed above, devices, systems, and methods for determination and notification of location of a building safety system event are described herein. One system includes an event detection device configured to detect an event within a building and a fire panel configured to receive information about the event or event detection device and transmit the information to a remote server and to a computing device. The computing device may be configured to determine, based on the information, a floor of the building on which the event was detected, and transmit a floorplan corresponding to the floor of the building on which the event was detected to the remote server. The remote server may be configured to generate, based on the information received from the fire panel and the floorplan received from the computing device, a visual floor representation indicating the specific location within the floor of the event. The remote server may then transmit the visual floor representation to a software application comprising executable instructions stored on the remote server or on another computing device to present the visual floor representation to a user through a display.

In the following detailed description, reference is made to the accompanying drawings that form a part hereof. The drawings show by way of illustration how one or more embodiments of the disclosure may be practiced. To the extent that the drawings contain descriptive text, this descriptive text is meant for example illustration only.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 402 in FIG. 4.

As used herein, "a", "an", or "a number of" something can refer to one or more such things, while "a plurality of" something can refer to more than one such things. For example, "a number of components" can refer to one or more components, while "a plurality of components" can refer to more than one component.

Figure 1:
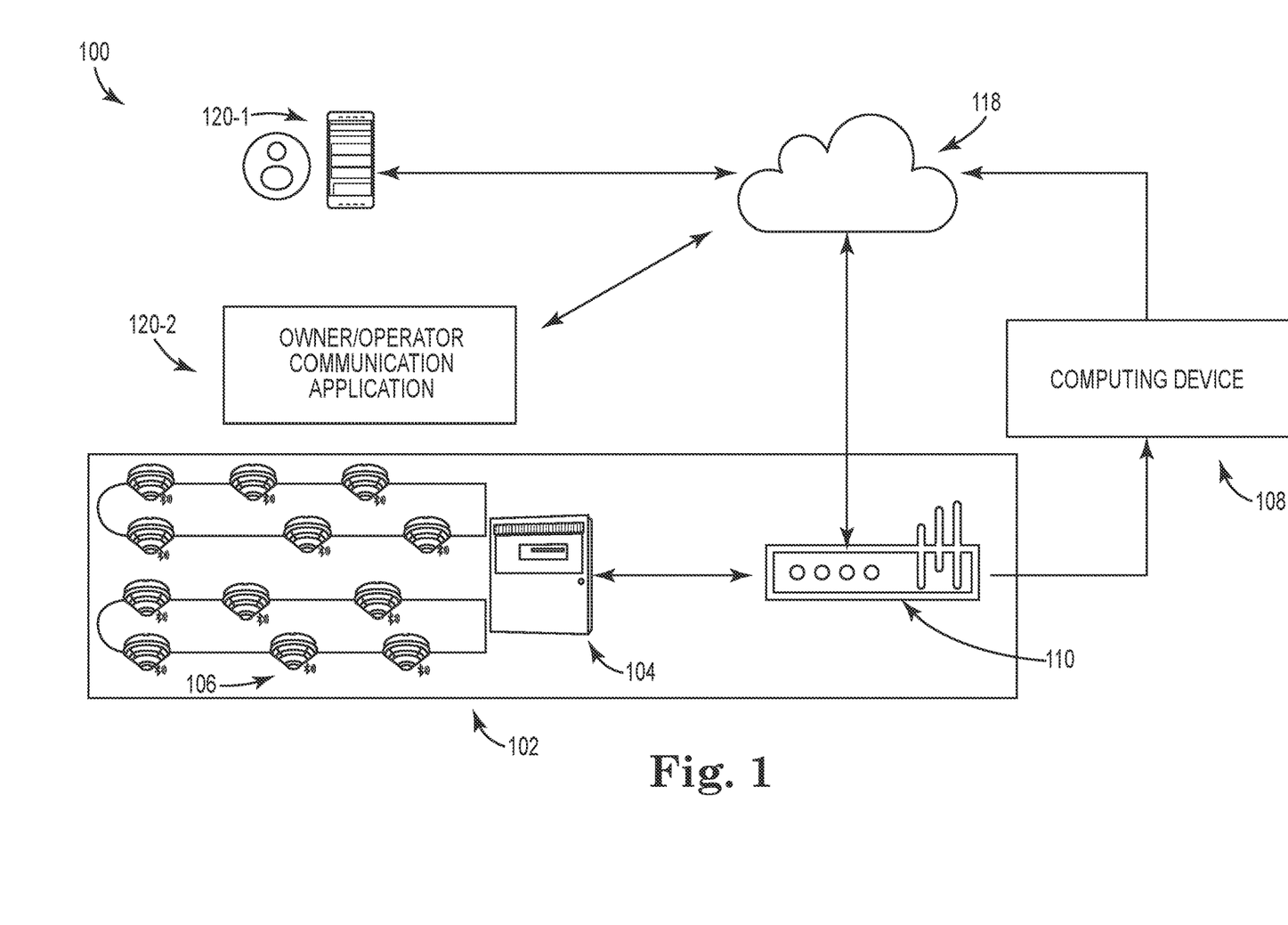
FIG. 1 is an example of a building safety event notification system for use in accordance with one or more embodiments of the present disclosure.

FIG. 1 is an example of a building safety event notification system for use in accordance with one or more embodiments of the present disclosure. In the illustrated embodiment, the building safety event notification system 100 includes an alarm system 102, a central monitoring station having at least one computing device 108, a remote server (e.g., cloud server) 118, and one or more building owner/operator communication applications 120-1 and 120-2.

An event alarm signal is generated in response to data from one or more alarm system devices 106 (e.g., smoke detectors) within the alarm system 102 indicating that an event may be occurring. As used herein, the term "event" may refer to any condition occurring within the building, such as a fire, smoke, or chemical sensor activation, an alarm trigger (pull station), or a breach of security. It may also be referred to as a fault detected in any of the components of the system 100, such as a fault in one or more of the alarm system devices 106. The central monitoring station may be staffed by employees of the provider of the alarm system 102, and they may not know specific details of each building they are monitoring, but rather, are charged with alerting appropriate response personnel based on the type of response needed and coordinating the response to the building to address the event that is occurring at the building.

The alarm system 102 can be any system that is used to monitor events that will affect occupants of the building. As shown in FIG. 1, the alarm system illustrated is a fire alarm system and includes a number of alarm system devices 106 and a control panel 104 for managing the operation of the alarm system 102 and its devices.

As used herein, the term "control panel" refers to a device to control components of an alarm system of a facility (building). For example, the control panel 104 can be a fire control panel that can receive information from event devices 106 and determine whether a hazard event is occurring or has occurred. The control panel may be configured to transmit information about the hazard event to the computing device 108 and to the cloud 118. This information, may include, for example, a unique identifier of the event device 106 which detected the event, a date and time of the event, a status of the event (e.g., resolved, unresolved), or an event type (e.g., smoke detected, communication fault).

The control panel 104 can be connected to the number of alarm system devices 106. As used herein, the term "alarm system device" refers to a device that can receive an input relating to an event. Such an event can be, for instance, a hazard event such as a fire. For example, an alarm system device can receive an input relating to a fire occurring in the facility. Such alarm system devices 106 can be a part of an alarm system of the facility and can include devices such as fire sensors, smoke detectors, heat detectors, carbon monoxide (CO) detectors, other chemical detector, or combinations of these; interfaces; pull stations; input/output modules; aspirating units; and/or audio/visual devices, such as speakers, sounders, buzzers, microphones, cameras, video displays, video screens, among other types of alarm system devices.

These alarm system devices 106 can be automatic, self-test devices, such as smoke detectors, heat detectors, CO detectors, and/or others. Such self-test devices can include mechanisms that generate aerosols, heat, carbon monoxide, etc. and sense these items as appropriate to the type of device being tested in the device to test the performance of the device. This can, for example, be to test the event device's thermal, chemical, and/or photo sensing capabilities.

The alarm system 102 can also include an edge/gateway device 110. The gateway device 110 acts as a pass-through device for communicating between the alarm system 102 in the building and the central monitoring station 108 and other components of the event notification system 100 that are at remote locations (i.e., outside the building).

In the embodiments of the present disclosure, a gateway device 110 of an alarm system 102 at a facility (building) reports event alarm signals to one or more central monitoring servers. These servers may be on premise (within the facility) or, as shown in the example of FIG. 1, off premise (at a remote location from the alarm system components including the gateway device).

From there, the event alarm signals are reported to the appropriate central monitoring station. This is done through the computing device 108. For example, information about event alarm signals may be displayed on a graphical user interface of a remote or local application on the computing device 108. The central monitoring station that includes administrators that, as discussed above, coordinate activities to respond appropriately based on the type of event that is occurring. For example, a fire event would need a fire-based response that would likely include alerting a fire station to send trucks and contacting medical personnel, if injuries seem likely. For a security issue, security personnel and/or the police would be contacted. For an issue relating to the operation of an alarm system device 106, a technician would be contacted and directed to the location of the faulty alarm system device 106. The central monitoring servers are connected back to one or more alarm systems on site and/or remote (cloud) servers, such as alarm system 102 and remote server 118.

Event alarm signals are also transmitted to the remote server 118. These signals may include, for example, the time and date of the event, a network name, a unique identifier of the device(s) 106 which detected the event, an event type, or an event status. The remote server 118 may transmit this information to authorized users through applications 120-1 and 120-2. For example, 120-1 may be a mobile application accessible through a mobile device, and 120-2 may be a remote application accessible through a network and a personal computer. In this embodiment, this information is represented only textually. Although a very experienced user who knows the building incredibly well may be able to decipher the location of the event based on information provided, such as the unique device identification number, most users will not be able to determine the exact location within a floor of the event through applications 120-1 and 120-2 alone.

Floorplans of each floor of the building may be accessible through the computing device 108. For example, such floorplans may be stored in the memory of the computing device 108. They may also be accessible through an application on the computing device 108. These building floorplans may be configured to include specific locations of all of the alarm system devices 106. However, since the computing device 108 may not be in communication with the remote server 118 or the applications 120-1 and 120-2, these floorplans will not enhance the notifications of events received by the users through the applications 120-1 and 120-2. It may be very difficult for users of these applications 120-1 and 120-2 to respond quickly and appropriately to the event notification, since they won't have a visual representation of the exact location of the event.

Figure 2:
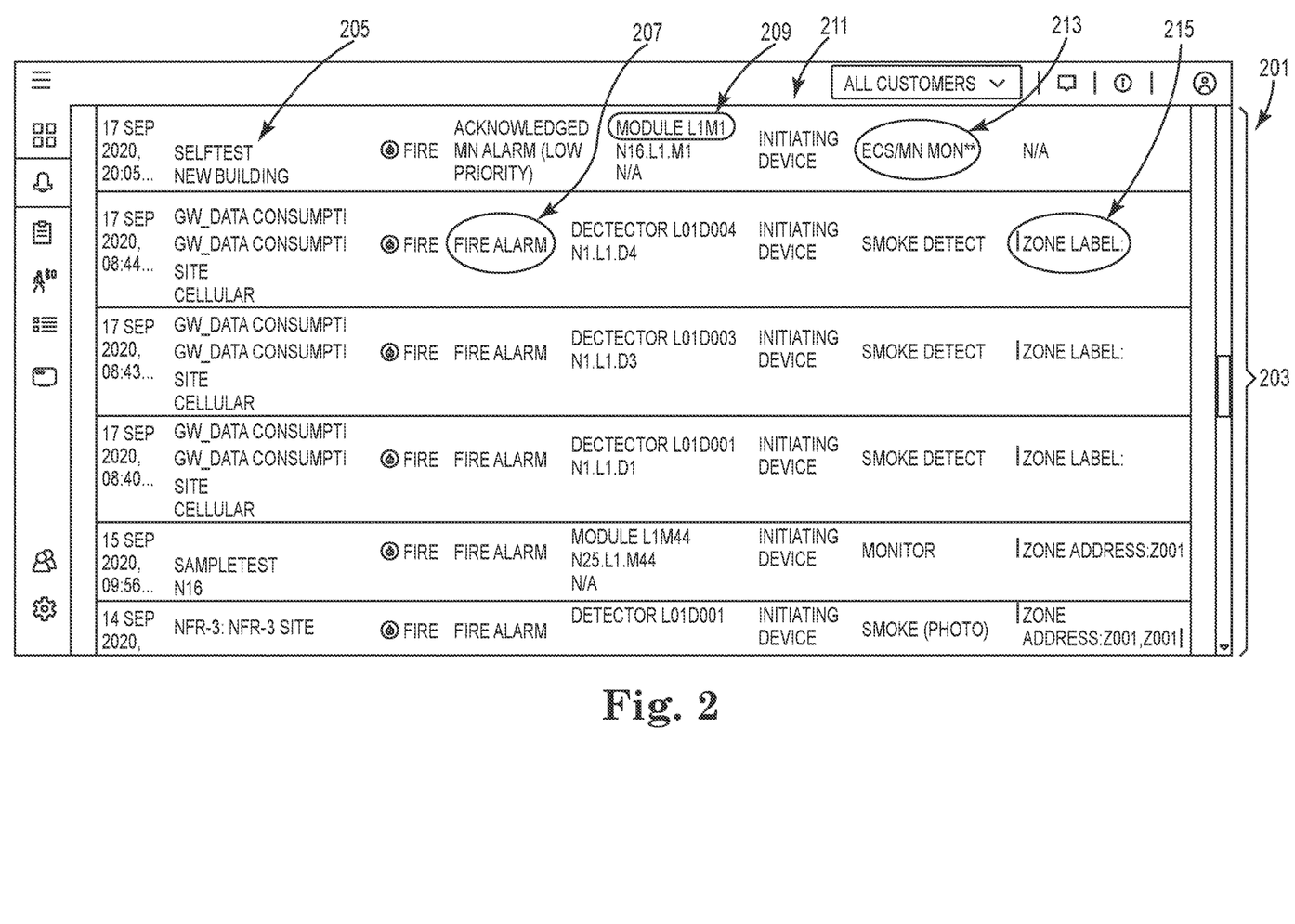
FIG. 2 is an illustration of a display screen provided on a user interface of a remote or local application showing a summary of events of a building safety system, generated in accordance with one or more embodiments of the present disclosure.

FIG. 2 is an illustration of a display screen 201 provided on a user interface of an application (e.g., application 120-2 of FIG. 1) showing a summary of events of a building safety event notification system (e.g., system 100 of FIG. 1), generated in accordance with one or more embodiments of the present disclosure. As shown in FIG. 2, the display screen 201 may list event notifications 203 corresponding to event signals received from the remote server (e.g., remote server 118). Event notifications 203 are primarily textual representations of information transmitted in the event signal. For example, event notifications 203 may include, but are not limited to: a date and time 205 of the event (e.g., "17 Sep. 2020 20:02"), a device type 207 of the device (e.g., device 106) detecting the event (e.g., "Fire Alarm"), a unique indicator 209 of the device (e.g., "Module L1M1"), a status 211 relating to the event (e.g., "Initiating Device"), an event type 213 (e.g., "SMOKE DETECT"), and a general location 215 of the detection device. Each floor of the building may be represented by a general location indicator 215.

Figure 3:
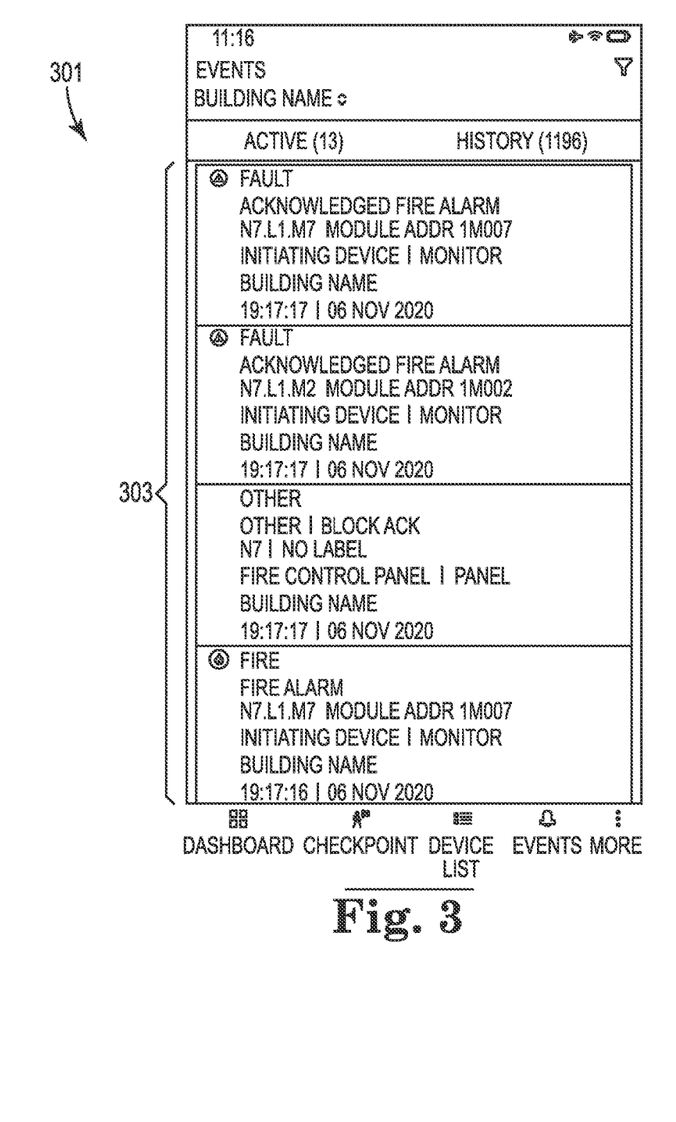
FIG. 3 is an illustration of a display screen provided on a user interface of a mobile device showing a summary of events of a building safety system, generated in accordance with one or more embodiments of the present disclosure.

FIG. 3 is an illustration of a display screen 301 provided on a user interface of a mobile device (e.g., mobile application 120-1 of FIG. 1 provided on a mobile device) showing a summary of events of a building safety system (e.g., system 100 of FIG. 1), generated in accordance with one or more embodiments of the present disclosure. In other words, FIG. 3 is an illustration of a version of the display screen 201 of FIG. 2, adapted for a mobile device. Similarly, display screen 301 may display a list of notifications 303 corresponding to event signals received and including various pieces of information about the event, including that described in connection with FIG. 2.

Figure 4:
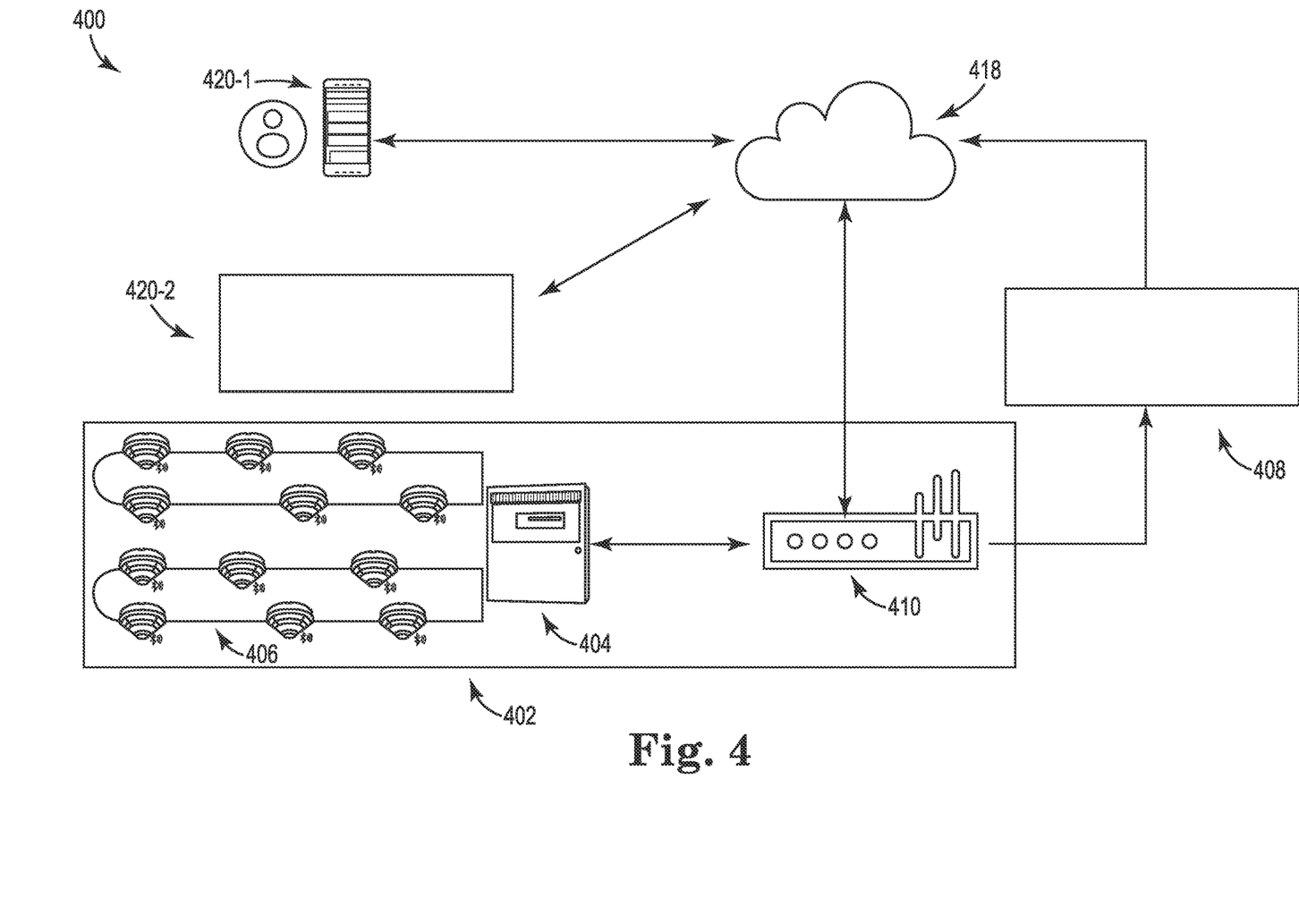
FIG. 4 is an illustration of a building safety event notification system for use in accordance with one or more embodiments of the present disclosure.

FIG. 4 is an illustration of a building safety event notification system 400 for use in accordance with one or more embodiments of the present disclosure. In the illustrated embodiment, the building safety event notification system 400 includes an alarm system 402, a central monitoring station having at least one computing device 408, a remote server (e.g., cloud server) 418, and one or more building owner/operator communication applications 420-1 and 420-2.

The alarm system 402 may include a number of event detection devices 406. Devices 406 may be detection devices analogous to devices 106 described in connection with FIG. 1. Devices 406 may be configured to detect an event within the building, such as a fault in one of the devices 406 or a fire, among other hazardous conditions. Devices 406 may then transmit an event alarm signal to a control panel 404. Control panel 404 may compile information about the event and/or the detection device 406, such as the type of event alarm signal received, the date and time of receipt, a unique indicator of the device 406 from which it was received, and an indicator of the floor of the building on which the device 406 is located. This information may be transmitted to the computing device 408 and to the remote server 418.

The alarm system 402 can also include an edge/gateway device 410 through which the information is transmitted to the remote server 418 and to the computing device 408. The gateway device 410 acts as a pass-through device for communicating between the alarm system 402 in the building and the central monitoring station 408 and other components of the event notification system 400 that are at remote locations (i.e., outside the building).

The gateway device 410 can also include edge intelligence functionality that detects when an event alarm condition exists at one alarm system device and collects data from other devices nearby the one indicating the event alarm condition. This information can be beneficial to, for example, provide a fuller picture of the incident.

For instance, the edge intelligence can indicate that there are four smoke detector devices (e.g., devices 406) to the south of the device indicating the alarm that have smoke levels that have slightly increased which indicates that to central monitoring personnel which direction a fire may be spreading and that those detector devices are operational for monitoring the status of the situation.

The gateway device 410 can also provide other important functions. For example, during commissioning of the alarm system 402, the gateway device 410 can provide a functionality that detects quality of connection of the alarm system devices 406 and the gateway device 410 and can report weak connections to technicians during the commissioning process or during operation of the system. It can identify what connections are problematic and identify the location of the issue, in some instances, to direct the technician to the problem. In some embodiments, the gateway device 410 can also identify trends of problems, for example, where it indicates that every few weeks or months, a problem occurs in a certain area which may prompt a technician to investigate activities in that space that may be triggering the recurrent problem.

In the embodiments of the present disclosure, the gateway device 410 of an alarm system 402 at a facility (building) receives event alarm signals from the control panel 404 and reports event alarm signals to one or more central monitoring servers. These servers may be on premise (within the facility) or, as shown in the example of FIG. 4, off premise (at a remote location from the alarm system components including the gateway device).

From there, the event alarm signals are reported to both the remote server 418 and the appropriate central monitoring station (i.e., the computing device 408). For example, information about event alarm signals may be displayed on a graphical user interface of an application on the computing device 408. The central monitoring station includes administrators that coordinate activities to respond appropriately based on the type of event that is occurring. For example, a fire event would need a fire-based response that would likely include alerting a fire station to send trucks and contacting medical personnel, if injuries seem likely. For a security issue, security personnel and/or the police would be contacted. For an issue relating to the operation of an alarm system device 406, a technician would be contacted and directed to the location of the faulty alarm system device 406. The central monitoring servers are connected back to one or more alarm systems on site and/or remote (cloud) servers, such as alarm system 402 and remote server 418.

The computing device 408 contains floorplans of each floor of the building, either stored on the memory of the computing device 408 or accessible to the computing device 408 through a software application with executable instructions, for example, stored on the remote server 418. These floorplans include exact locations within each floor of each alarm device 406.

Thus, when the computing device 408 receives the event alarm signal from the gateway device 410, the computing device 408 can use the unique indicator/identifier of the alarm device 406 and the indicator of the floor on which the alarm device 406 is located to determine the floor on which the event has occurred and generate a floorplan of that floor. The floorplan may show the specific location within the floor of the event. This may be done by generating the floorplan for the appropriate floor and highlighting or otherwise indicating a specific region within that floorplan which is monitored by the device 406 reporting the event, thus creating a visual representation of the floor. This visual representation can then be transmitted to the remote server 418.

Event alarm signals, which include all the information compiled by the control panel 404, are also transmitted to the remote server 418. The remote server 418 may then perform analytics on both the event alarm signals received from the gateway device 410 and the floorplan received from the computing device 408 to generate a visual floor representation. This visual floor representation may resemble the floorplan generated by the computing device 408, with the specific location corresponding to the event indicated. However, the visual floor representation may also include any other information received from the event alarm signal, such as the type of event or the time and date at which the event was reported.

The remote server 418 may transmit this visual floor representation to authorized users through applications, such as applications 420-1 and 420-2. For example, 420-1 may be a mobile application accessible through a mobile device, and 420-2 may be a local or remote application accessible through a personal computer or mobile device. The visual floor representation is further described in connection with FIGS. 5, 6, 7, 8A, and 8B.

Applications 420-1 and 420-2 may be software applications accessible through a computing device, such as a personal computer or a mobile device, such as a laptop or phone. Applications 420-1 and 420-2 may include executable instructions stored on the memory of the computing device 408 to present the visual floor representation to the user through a graphical user interface. Applications 420-1 and 420-2 may also be remote software applications (e.g., web applications) that include executable instructions stored on the remote server 418 to present the visual floor representation to the user through a graphical user interface of a display device. Such applications may be accessible, for example, through a web browser. The application may be similar to applications used by the computing device 408 to access floorplans stored on the remote server 418.

As shown in the example of FIG. 4, the event notification system 400 can have various connections secured to reduce or eliminate unauthorized connections to the system. For example, in some embodiments, a security protocol can be utilized wherein the real time status information can only be made available for those parties that enter, for example, a user name and password, authorizing the system to provide such information to a party. Such embodiments can also be customizable such that parties with different authorization levels can access different information. These levels and the information types that are made available to each level can be customized, for example, by the building owner/operator or alarm system provider at the time the system is configured or once the system is set up.

The event notification system 400 can also allow workflow to be defined for different types of alarms, and when progress of one stage is moved to another stage, the graphical user interface can show the current stage details in the user interface. In this way, the building owners/operators can quickly ascertain the status of the event without having to navigate through the mobile application.

The remote server 418 can also include artificial intelligence functionality that can, for example, inform the receiver of the information that a similar incident happened on a particular date, the period of time that it took to respond to that previous incident, the current time it has taken to respond to the present incident, based on data regarding one or more prior incident's data the estimated time to completely resolve the present incident. This could be achieved, for example, by applying an inference model. This can be beneficial, for instance, by informing the building owner/manager of the timeframe, so that they know how long they have to perform any incident related actions they may have to do.

Figure 5:
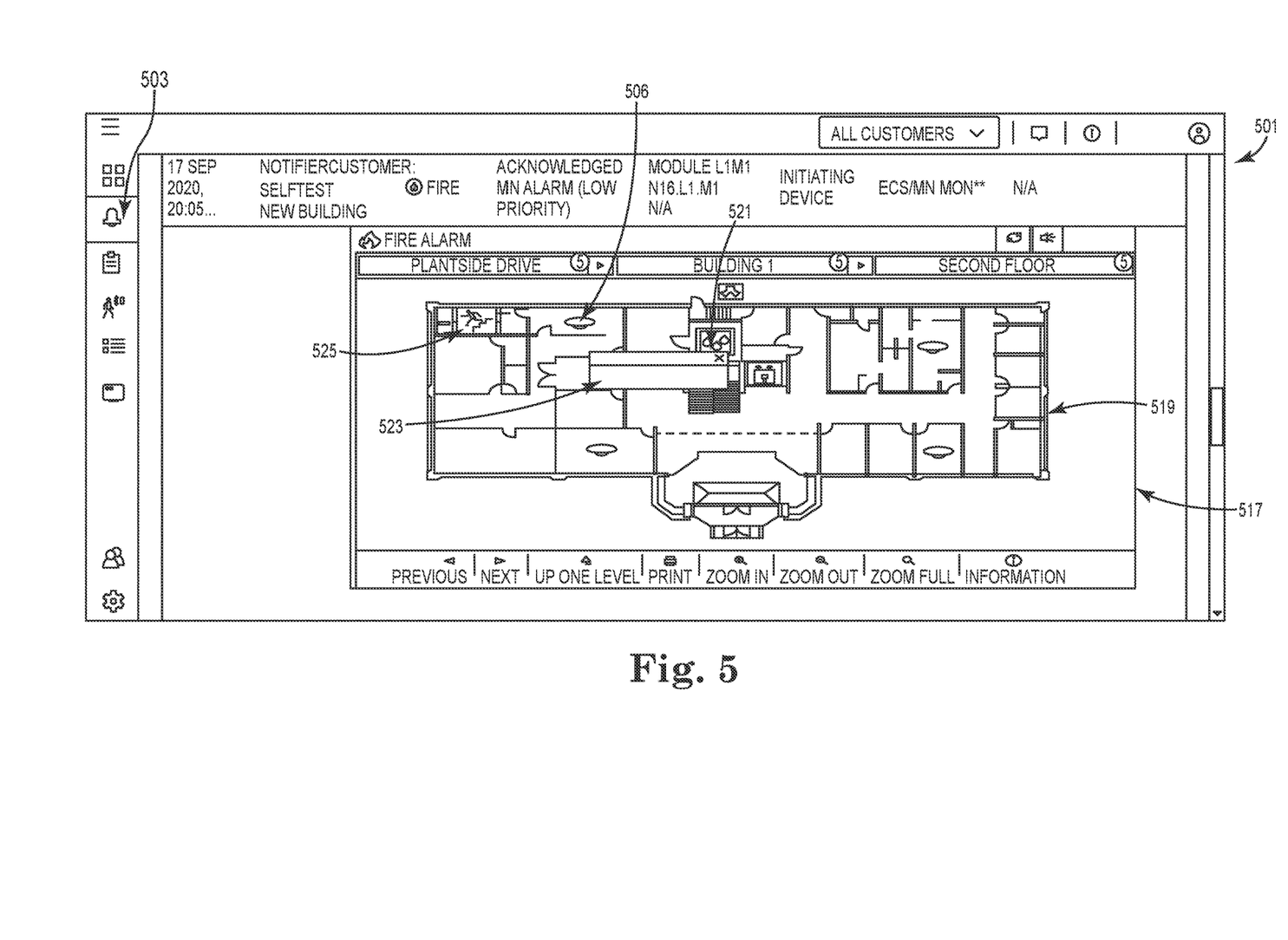
FIG. 5 is an illustration of a display screen provided on a user interface of a remote or local application showing a visual floor representation of a floor on which an event has occurred, generated in accordance with one or more embodiments of the present disclosure.

FIG. 5 is an illustration of a display screen 501 provided on a user interface of a remote or local application (e.g., application 420-2 of FIG. 4) showing a visual floor representation 517 of a floor on which an event has occurred, generated in accordance with one or more embodiments of the present disclosure. As shown in FIG. 5, the visual floor representation 517 may include a floorplan 519 for the floor corresponding to the alarm device reporting the event. This floorplan 519 may have been accessible through a computing device (e.g., computing device 408 of FIG. 4) prior to the event alarm signal.

The visual representation 517 may include an indication of a specific area 521 at which an event has occurred. As described previously, this specific area 521 may be determined by a computing device based on an area monitored by the alarm device 506 reporting the event. Moreover, the remote server (e.g., remote server 418 of FIG. 4) may further refine this area 521 through inputs and event alarm signals received from other alarm devices 506. For example, if two alarm devices 506 monitor overlapping areas and one alarm device 506 detects an event but the other does not, the remote server may determine that the event has not occurred in the overlapping areas. Thus, the specific area 521 may be reduced to only those areas monitored by the detecting alarm device but not the non-detecting alarm device.

Text 523 may be shown adjacent to the specific area 521, providing more information about the event alarm signal. For example, the visual floor representation 517 may display information about the type of event detected, the time at which the event was detected, or operational statuses or identifiers of one or more event detection alarm devices 506. Furthermore, notifications 503 of the event alarm signal(s) received may be displayed along with some or all the information transmitted within that signal. In some instances where multiple events are detected within the same floor, multiple regions may be indicated, not just region 521 corresponding to the first event. Where events are detected on different floors, a second visual floor representation may open in a separate window of the display, as described in further detail in connection with FIG. 8A.

The visual floor representation 517 may be updated continuously as events are resolved. For example, if a detection alarm device detects a resolution of an event, or if the user receives a notification of the resolution through the application, the visual floor representation may be updated to no longer show the specific area of that event.

The visual floor representation 517 may also include indicators of exits 525 so that the user can easily see possible escape routes.

Figure 6:
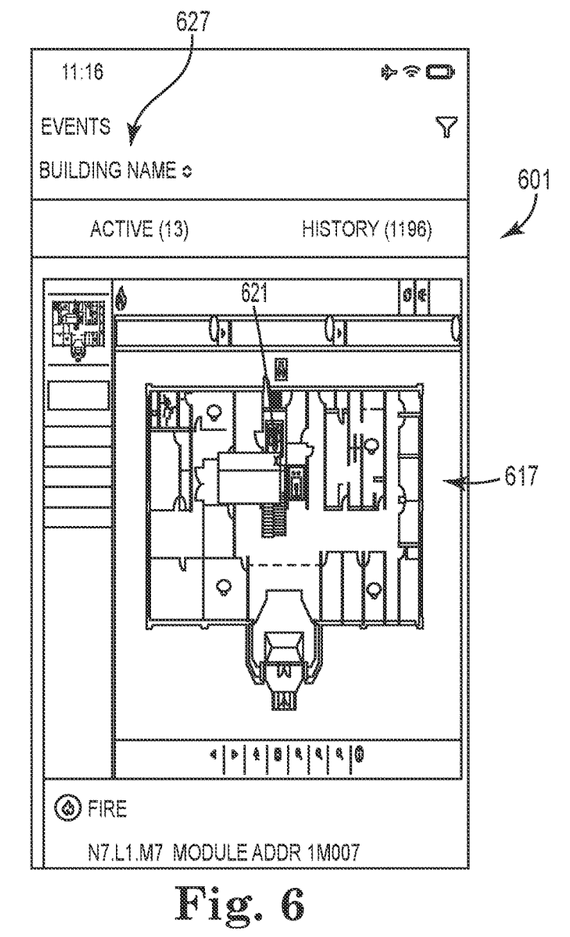
FIG. 6 is an illustration of a display screen provided on a user interface of a mobile application showing a visual floor representation of a floor on which an event has occurred, generated in accordance with one or more embodiments of the present disclosure.

FIG. 6 is an illustration of a display screen 601 provided on a user interface of a mobile device (e.g., mobile application 420-1 of FIG. 4 of a mobile device) showing a visual floor representation 617 of a floor on which an event has occurred, generated in accordance with one or more embodiments of the present disclosure. In other words, FIG. 6 is an illustration of a version of the display screen 501 of FIG. 5, adapted for a mobile device. Similarly, display screen 601 may display a visual floor representation 617 of event signals received from a gateway device, with the specific locations 621 of such events indicated (e.g., by highlighting the specific locations 621).

As shown in FIGS. 5 and 6, embodiments of the present disclosure allow for ease in viewing and responding to event notifications by providing the user with a highly effective representation (517 and 617) of the specific event location within the floor on which the event occurred. Once the events have been resolved, these visual representations 517 and 617 may be stored within the applications.

In some embodiments, the same application may be used to view events in multiple buildings. For example, as shown in FIG. 6, the user may have the option to make a selection 627 of buildings to which they are given access.

Figure 7:
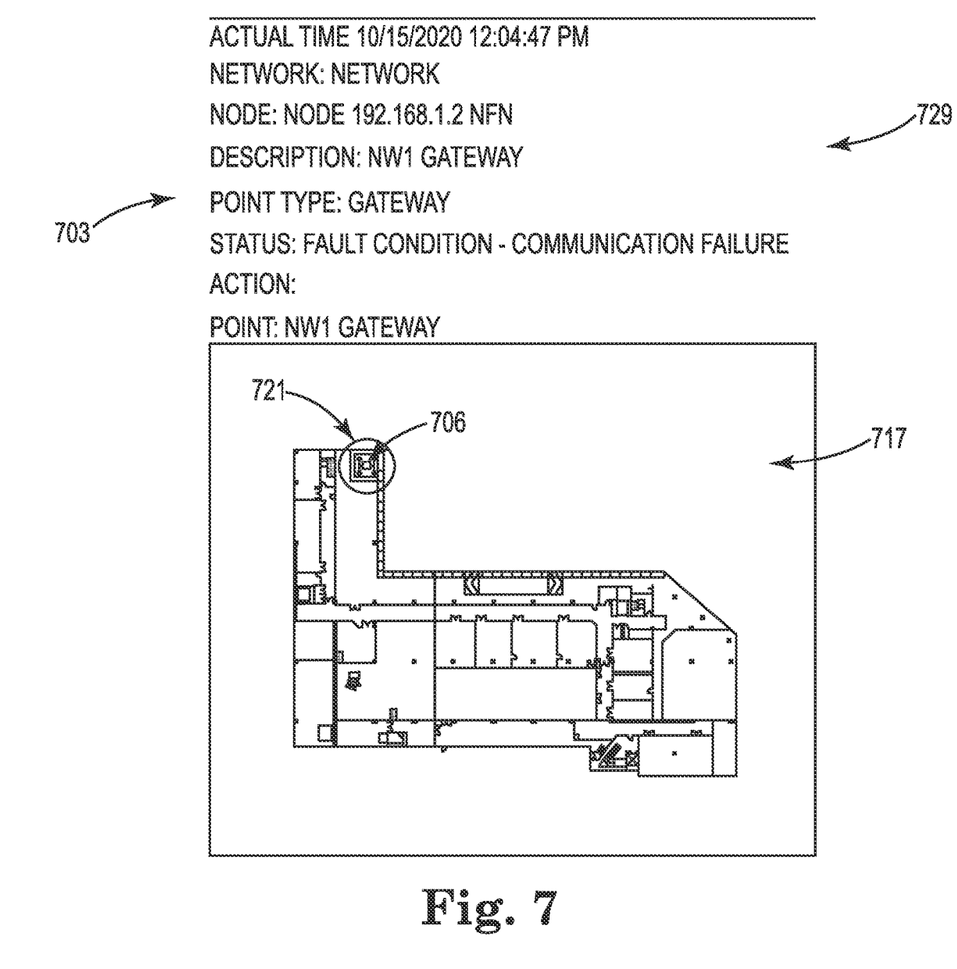
FIG. 7 is an illustration of a display screen provided on a user interface of a mobile device, showing an electronic mail notification of an event of a building safety system, generated in accordance with one or more embodiments of the present disclosure.

FIG. 7 is an illustration of a display screen 701 provided on a user interface of a mobile device, showing an electronic mail notification of an event of a building safety system, generated in accordance with one or more embodiments of the present disclosure. In embodiments of the present disclosure, systems (e.g., system 400) may be configured to automatically transmit a notification 729 of an event from a remote server (e.g., remote server 418) or from a software application (e.g., applications 420-1 and 420-2) to a pre-determined, authorized user through electronic mail.

This notification 729 may include a textual notification 703 including various types of information, such as a time and date of the detection of the event, an identification number corresponding to the event detection device, an event detection device type (e.g., smoke alarm), and/or a network name which the device is a part of, among other suitable information. However, the notification 729 may also include a visual floor representation 717 generated by the remote server. This visual representation 717 may include an indicator 721 of a specific location of an event. This indicator 721 may be, for example, a circle surrounding the alarm device 706 which detected the event.

Figure 8A:
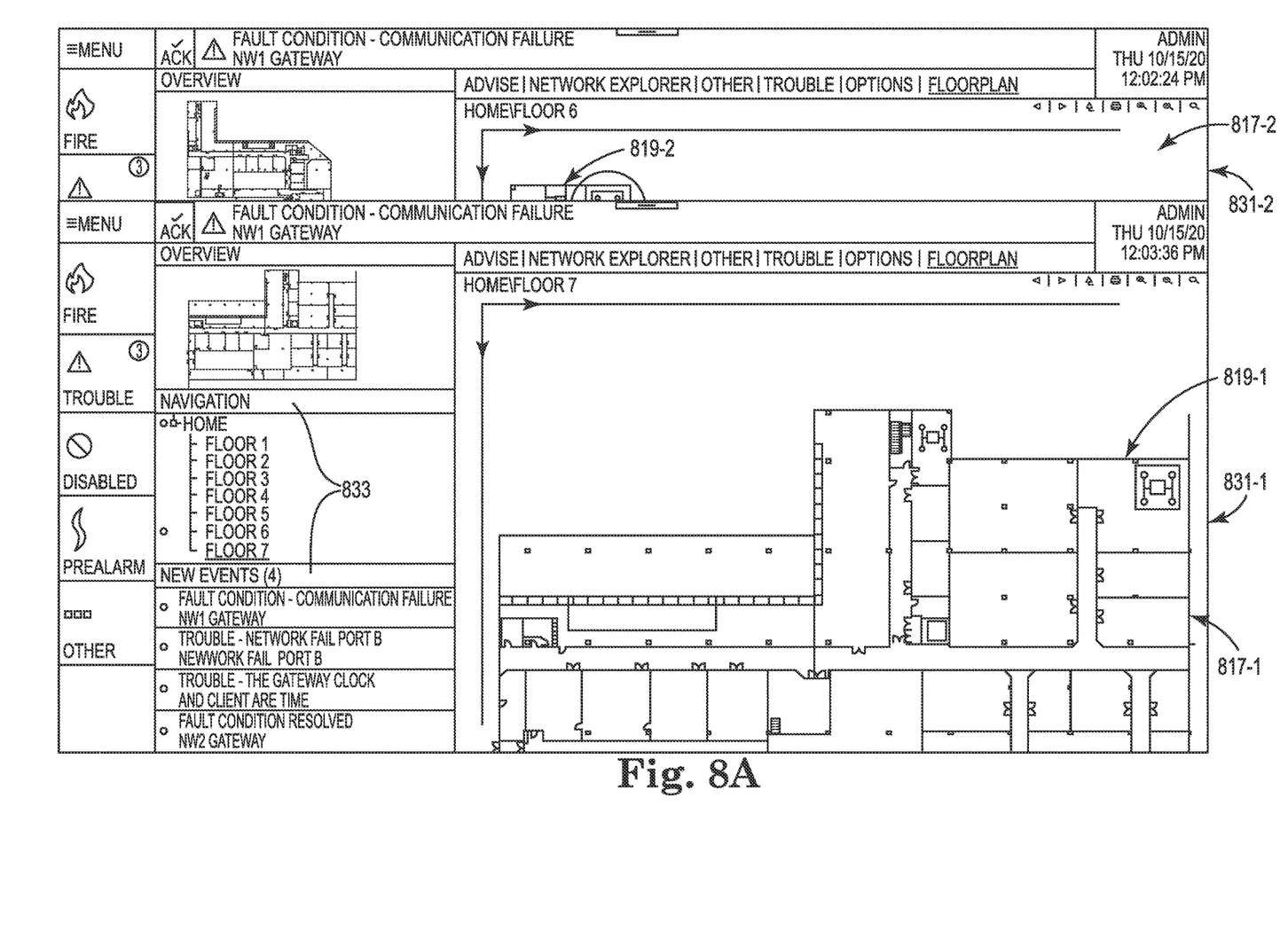
FIG. 8A is an illustration of a display screen provided on a user interface of a remote or local application, showing visual floor representations of one or more floors on which events have occurred, generated in accordance with one or more embodiments of the present disclosure.

FIG. 8A is an illustration of a display screen 801 provided on a user interface of an application (e.g., application 420-2 of FIG. 4), showing visual floor representations 817-1 and 817-2 of one or more floors 819-1 and 819-2, generated in accordance with one or more embodiments of the present disclosure. As illustrated in FIG. 8A, the graphical user interface may have two or more windows 831-1 and 831-2 open at one time, even if only one window (e.g., a front window 831-1) is visible on the display screen 801.

In some instances, a building safety system may detect an event on a certain floor 819-2 of the building while the visual floor representation 817-1 corresponding to a different floor 819-1 is open on the display screen 801. The application may be configured to capture an image of the visual floor representation 817-2 of the floor 819-2 on which the most recent event is detected and transmit a notification (e.g., notification 729 of FIG. 7) to pre-determined users without changing the display screen 801, since the second visual floor representation 817-2 will be displayed in a window 831-2 behind the first generated window 831-1. Thus, users can continue to use the application to view information about the floor 819-1 on the front window 831-1 uninterrupted while all of the necessary users are immediately notified of the event occurring on the other floor 819-2. Furthermore, as shown in FIG. 7, these users will receive a visual floor representation 717 that may eliminate their need to access another application to access the event information.

If the next event detected is detected by an alarm device on the same floor 819-1, the visual representation 817-1 corresponding to that floor may simply be updated to add an indicator for the specific location of the additional event.

Figure 8B:
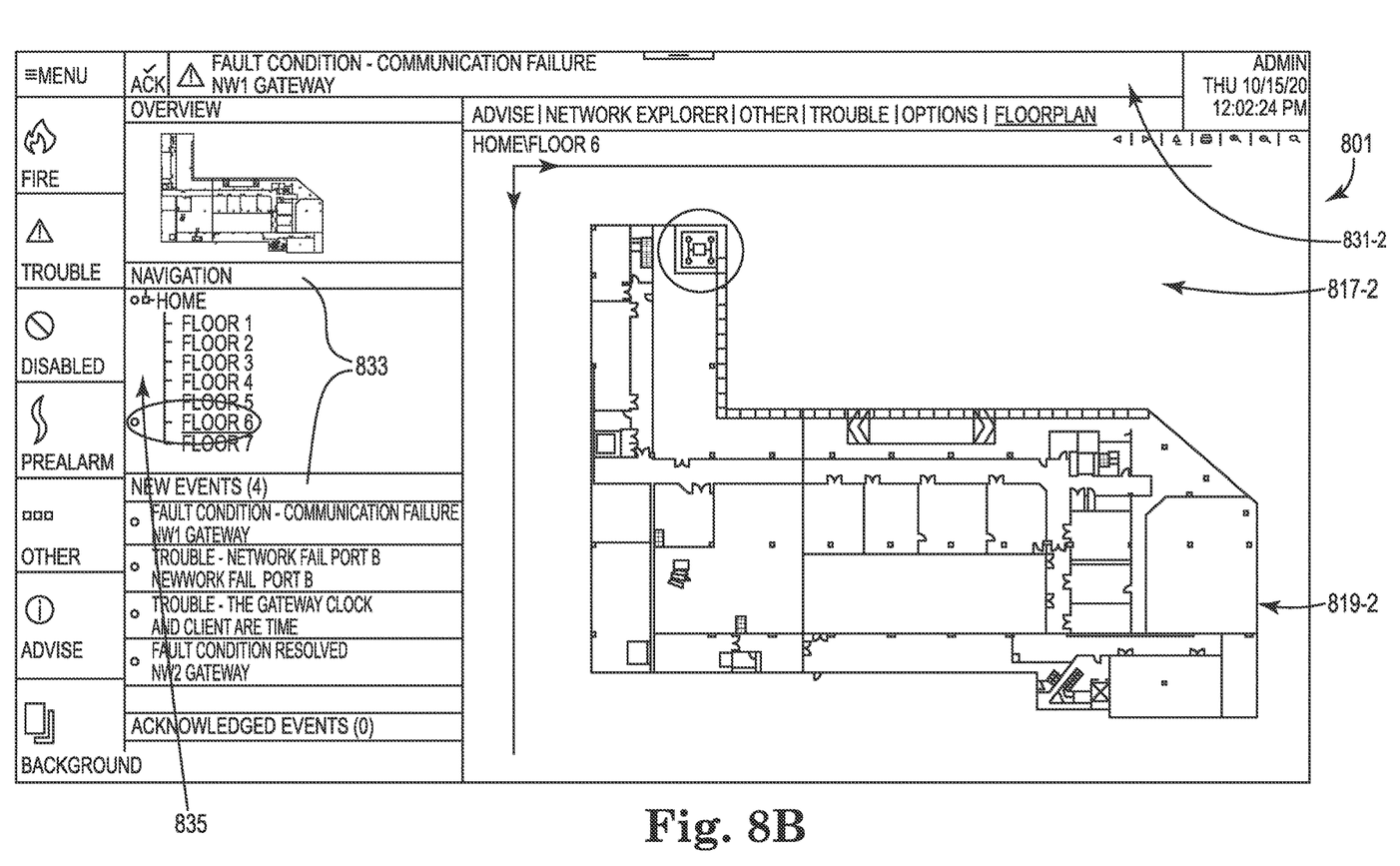
FIG. 8B is an illustration of a display screen provided on the user interface of the remote or local application of FIG. 8A, showing a visual floor representation of one of the floors on which events have occurred, generated in accordance with one or more embodiments of the present disclosure.

FIG. 8B is an illustration of a display screen 801 provided on the user interface of the application of FIG. 8A, showing a visual floor representation 817-2 of one of the floors 819-2 on which events have occurred, generated in accordance with one or more embodiments of the present disclosure. As illustrated in FIG. 8B, a user may choose to open a window 831-2 corresponding to a newly received event alarm signal. This window 831-2 will show a visual floor representation 817-2.

The window 831-2 will also show a real-time queue 833 of event alarm signals received by the system, which may be continuously updated to show only events that have not been resolved and corresponding floors for each event. The user of the application may access the visual floor representation, which includes the indication of the specific location of the event, as described in the foregoing, by selecting one of these event alarm signals in the queue 833. Alternatively, the user may view and interact with various visual representations of different floors 819 of the building through a panel 835.

There are several computing devices used for various functions in the building event notification system. Each of these computing devices (e.g., gateway device, control panel, remote server, building owner/operator communication device, central monitoring station server) include a processor and memory which can function as described below. Also described below are other items that may be provided on such computing devices, such as user input and output components.

The memory can be any type of storage medium that can be accessed by the processor to perform various examples of the present disclosure. For example, the memory can be a non-transitory computer readable medium having computer readable instructions (e.g., executable instructions/computer program instructions) stored thereon that are executable by the processor in accordance with the present disclosure.

The memory can be volatile or nonvolatile memory. The memory can also be removable (e.g., portable) memory, or non-removable (e.g., internal) memory. For example, the memory can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical storage, and/or a magnetic medium such as magnetic cassettes, tapes, or disks, among other types of memory.

Further, although memory is illustrated as being located within the computing device, embodiments of the present disclosure are not so limited. For example, memory can also be located internal to another computing resource (e.g., enabling computer readable instructions to be downloaded over the Internet or another wired or wireless connection).

A computing device can also include a user interface. For example, the user interface can display the embodiments illustrated in FIGS. 2, 3, 5, 8A, and 8B.

A user (e.g., operator) of computing device can interact with the computing device via the user interface. For example, the user interface can provide (e.g., display and/or present) information to the user of the computing device, and/or receive information from (e.g., input by) the user of computing device. For instance, in some embodiments, user interface can be a graphical user interface (GUI) that can provide and/or receive information to and/or from the user of the computing device. The display can be, for instance, a touch-screen (e.g., the GUI can include touch-screen capabilities). Alternatively, a display can include a television, computer monitor, mobile device screen, other type of display device, or any combination thereof, connected to mobile device and configured to receive a video signal output from the mobile device.

As an additional example, the user interface can include a keyboard and/or mouse the user can use to input information into the computing device. Embodiments of the present disclosure, however, are not limited to a particular type(s) of user interface.

User interface can be localized to any language. For example, user interface can utilize in any language, such as English, Spanish, German, French, Mandarin, Arabic, Japanese, Hindi, etc.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for notifying a user of a fire system event, comprising:
    detecting a first event in a building through a first event detection device;
    transmitting information about at least one of the first event or the first event detection device to a remote server and to a first computing device, wherein the first computing device includes a memory wherein a floorplan of each floor of the building is stored;
    determining, based on the information and through the first computing device, a floor of the building on which the first event was detected;

transmitting a particular floorplan of the floor of the building on which the first event was detected to the remote server;
determining, based on the information, a specific location within the floor at which the first event was detected;
generating a first visual floor representation, including an indication of the specific location, based on the particular floorplan and the specific location; and
transmitting the first visual floor representation to a software application comprised of instructions executable by a processor and stored in memory to present the visual floor representation to a user.

2. The method of claim 1, wherein the particular floorplan is transmitted to the remote server from the first computing device.

3. The method of claim 1, wherein the first computing device is at least one of:
a mobile device; or
a personal computer.

4. The method of claim 1, wherein the information includes an identifier of the first event detection device which is unique from identifiers of other event detection devices within the building.

5. The method of claim 1, wherein the information is transmitted to the remote server and to the first computing device through a gateway device.

6. The method of claim 1, further comprising detecting a second event in a building through a second event detection device.

7. The method of claim 6, further comprising, if the second event detection device is located on the particular floor, updating the first visual floor representation to include an indication of the specific location within the particular floor at which the second event was detected.

8. The method of claim 6, further comprising, if the second detection device is located on a floor different from the particular floor:
generating a second visual floor representation, including an indication of the specific location of the second event; and
presenting the second visual floor representation to a user through the application, via a user interface;
generating a first window via the application, wherein the first visual floor representation is displayed to the user on the user interface; and
generating a second window behind the first window via the user device application, wherein the second visual floor representation is displayed to the user on the user interface.

9. The method of claim 1, further comprising detecting a resolution of the first event with the first event detection device or receiving notification of a resolution of the first event and updating the first visual floor representation with the first event detection device.

10. The method of claim 1, wherein the specific location is determined by the remote server or the first computing device based on a location of the first event detection device stored in the memory of the first computing device and a range of the first event detection device stored in the memory of the first computing device.

11. A system for notifying a user of a fire system event, comprising:
an event detection device configured to detect an event within a building; and
a fire panel configured to receive information about the event or event detection device and transmit the information to a remote server and to a computing device;
wherein the computing device is configured to:
determine, based on the information, a floor of the building on which the event was detected; and
transmit a floorplan, corresponding to the floor of the building on which the event was detected, to the remote server; and
wherein the remote server is configured to:
generate, based on the information received from the fire panel and the floorplan received from the computing device, a visual floor representation indicating the specific location within the floor of the event; and
transmit the visual floor representation to a first software application comprising executable instructions stored on the remote server to present the first visual floor representation to a user through a display device.

12. The system of claim 11, wherein the visual floor representation also includes at least one of the following:
a type of event;
a time at which the event was detected;
one or more indicators of one or more additional event detection devices on the floor; or
operational statuses of one or more event detection devices on the floor.

13. The system of claim 11, wherein the first software application also includes a real-time display of the event and any other events which have not been resolved and corresponding floors for each event.

14. The system of claim 11, wherein the computing device includes a memory wherein floorplans of each floor of the building are stored.

15. The system of claim 11, wherein the computing device is further configured to access floorplans of each floor of the building through a second software application comprising executable instructions stored on the remote server.

16. A method for notifying a user of a fire system event, comprising:
detecting an event in a building through an event detection device;
transmitting information about at least one of the event or the event detection device to a remote server and to a first computing device, wherein the first computing device includes a memory wherein floorplans of each floor of the building are stored;
determining, based on the information and through the first computing device, a floor of the building on which the event was detected;
transmitting a particular floorplan of the floor of the building on which the event was detected to the remote server;
determining, based on the information, a specific location within the floor at which the event was detected;
generating a visual floor representation, including an indication of the specific location, based on the particular floorplan and the specific location; and
transmitting an electronic mail notification including the visual floor representation to an electronic mail inbox of a pre-determined user.

17. The method of claim 16, wherein the event is at a detection of at least one of the following:
smoke;
a fire alarm trigger;
a fault in one or more devices of the fire safety system on the floor; or
a breach of security.

18. The method of claim 16, further comprising transmitting the visual floor representation to a software application comprised of executable instructions stored in the memory of a second computing device to transmit the electronic mail notification to the pre-determined user.

19. The method of claim 18, wherein:
   the software application comprises a graphical user interface; and
   the visual floor representation is transmitted to the pre-determined user without displaying the visual floor representation on the graphical user interface.

20. The method of claim 16, wherein the electronic mail notification also includes a text description of at least one of the following:
   a time and date of the detection of the event;
   an identification number corresponding to the event detection device;
   an event detection device type; or
   a network name.

\* \* \* \* \*